(12) United States Patent
Hayakawa

(10) Patent No.: US 7,203,090 B2
(45) Date of Patent: Apr. 10, 2007

(54) HIGH OUTPUT NONVOLATILE MAGNETIC MEMORY

(75) Inventor: Jun Hayakawa, Sendai (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/488,719

(22) Filed: Jul. 19, 2006

(65) Prior Publication Data

US 2006/0256614 A1    Nov. 16, 2006

Related U.S. Application Data

(63) Continuation of application No. 11/003,473, filed on Dec. 6, 2004, now Pat. No. 7,102,923, which is a continuation of application No. 10/842,572, filed on May 11, 2004, now Pat. No. 6,842,368, which is a continuation of application No. 10/453,547, filed on Jun. 4, 2003, now Pat. No. 6,754,100.

(30) Foreign Application Priority Data

Nov. 28, 2002  (JP) ............................. 2002-345435

(51) Int. Cl.
*G11C 11/15* (2006.01)
(52) U.S. Cl. ...................... 365/173; 365/158; 365/171
(58) Field of Classification Search ................ 365/210, 365/171, 173, 158
See application file for complete search history.

(56) References Cited

U.S. PATENT DOCUMENTS

| 6,285,581 B1 | 9/2001 | Tehrani et al. |
| 6,567,299 B2 | 5/2003 | Kunikiyo et al. |
| 6,611,405 B1 | 8/2003 | Inomata et al. |
| 6,728,132 B2 | 4/2004 | Deak |
| 6,807,091 B2 | 10/2004 | Saito |
| 6,847,547 B2 | 1/2005 | Albert et al. |

OTHER PUBLICATIONS

T. Miyazaki and N. Tezuka, "Giant Magnetic Tunneling Effect in Fe/Al$_2$O$_3$/Fe Junction", Journal of Magnetism and Magnetic Materials 139 (1995), pp. L231-L234.

F. J. Albert, J.A. Katine, R.A. Buhrman, and D.C. Ralph, "Spin-Polarized Current Switching of a Co Thin Film Nanomagnet", Applied Physics Letters, vol. 77, No. 23, (Dec. 4, 2000), pp. 3809-3811.

Y. Ohno, D.K. Young, B. Beschoten, F. Matsukura, H, Ohno and D. D. Awschalom, "Electrical Spin Injection in a Ferromagnetic Semiconductor Heterostructure", Nature, vol. 402 (Dec. 16, 1999), pp. 790-792.

*Primary Examiner*—Son Dinh
*Assistant Examiner*—Hien N Nguyen
(74) *Attorney, Agent, or Firm*—Reed Smith LLP; Stanley P. Fisher, Esq.; Juan Carlos A. Marquez, Esq.

(57) ABSTRACT

A magnetic memory is provided with a high-output memory cell capable of switching and magnetization reversal operations by means of two terminals. There is formed an MIS junction laminated layer comprising a diode, a spin transfer torque magnetization reversal induction layer, and a tunnel magnetoresistive device. A bit line and a word line are connected to the laminated layer.

6 Claims, 13 Drawing Sheets

F I G. 4
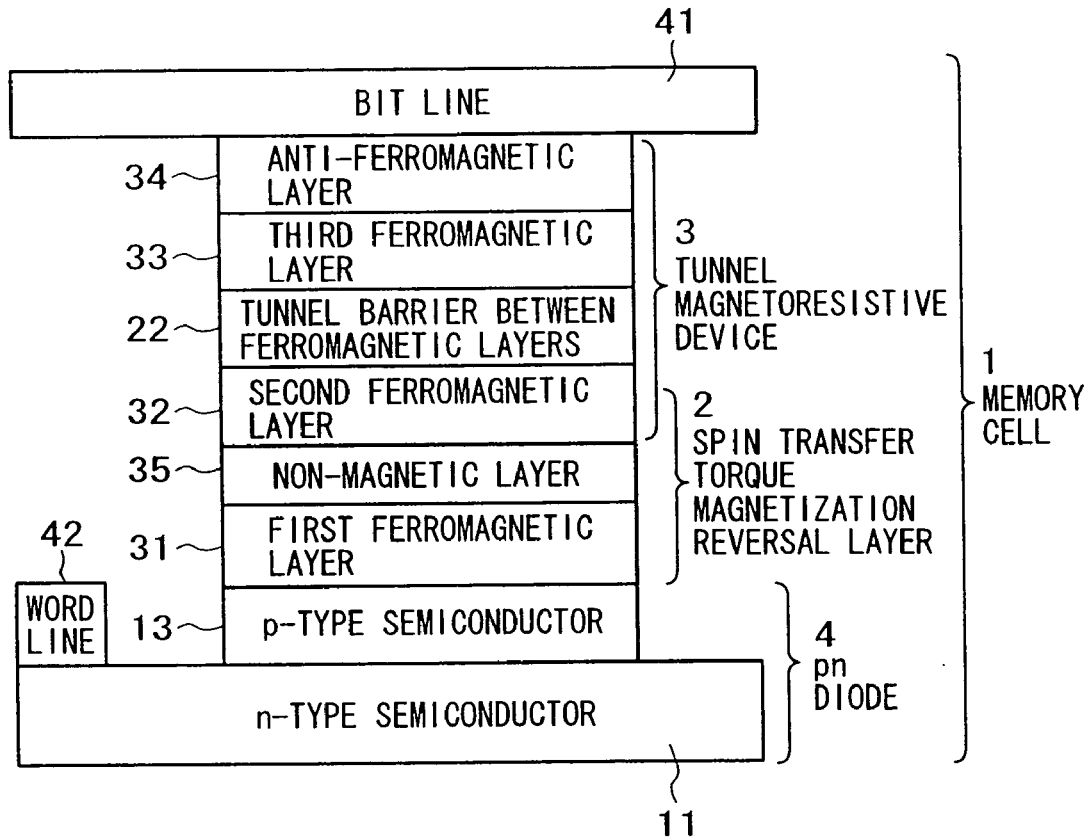
F I G. 5
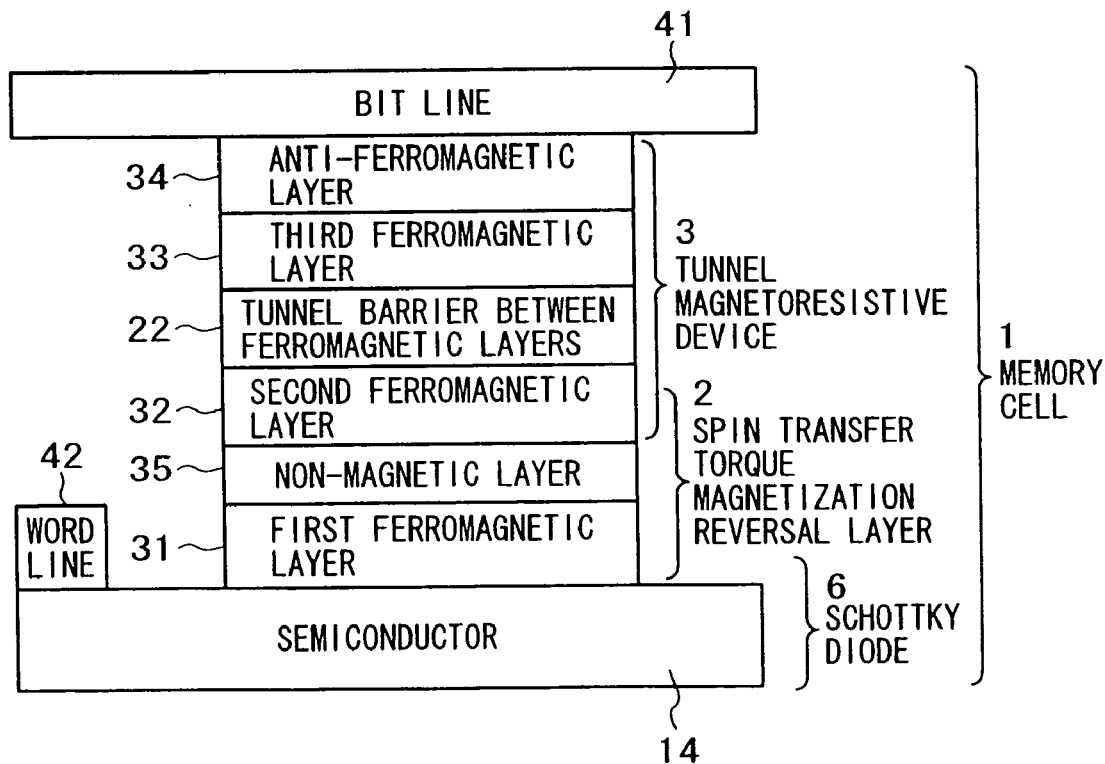

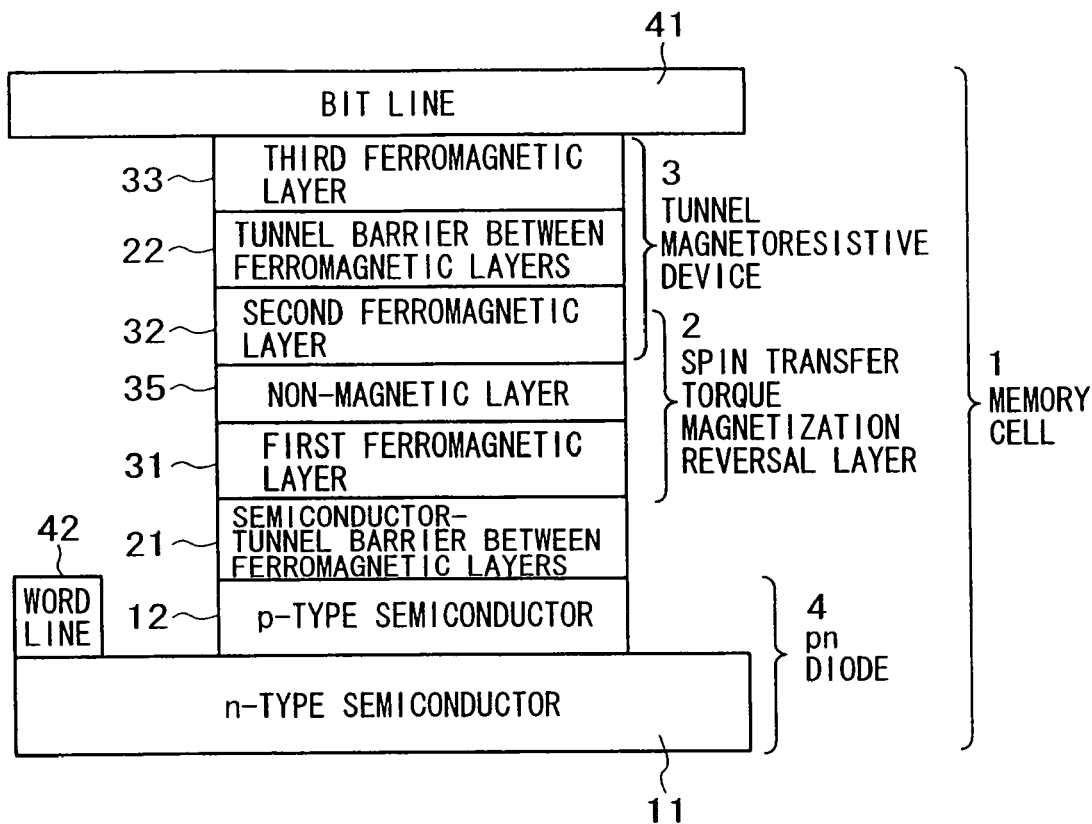
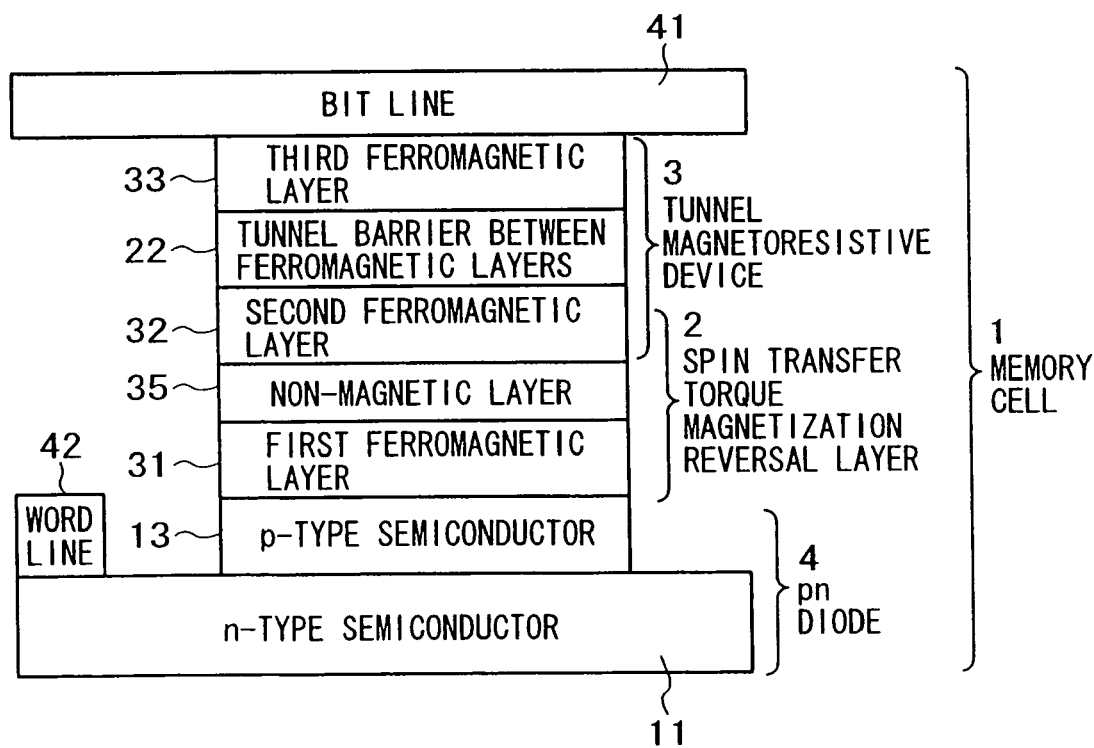

HIGH OUTPUT NONVOLATILE MAGNETIC MEMORY

CROSS-REFERENCE TO RELATED APPLICATIONS

This application is a Continuation application of U.S. application Ser. No. 11/003,473 filed Dec. 6, 2004 now U.S. Pat. No. 7,102,923, which is a Continuation of U.S. application Ser. No. 10/842,572 filed May 11, 2004 now U.S. Pat. No. 6,842,368, which is a Continuation of U.S. application Ser. No. 10/453,547 filed Jun. 4, 2003 now U.S. Pat. No. 6,754,100. Priority is claimed based on U.S. application Ser. No. 11/003,473 filed Dec. 6, 2004, which claims the priority of U.S. application Ser. No. 10/842,572 filed May 11, 2004, which claims the priority of U.S. application Ser. No. 10/453,547 filed Jun. 4, 2003, which claims the priority of Japanese Patent Application No. 2002-345435 filed Nov. 28, 2002, all of which is incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention generally relates to nonvolatile magnetic memories and, more particularly, to high-output nonvolatile magnetic memories having switching and spin torque magnetization reversal capabilities.

2. Discussion of Background

As shown in FIG. 14, conventional nonvolatile magnetic memory comprises a cell by forming a tunnel magnetoresistive (TMR) device on a complimentary metal-oxide semiconductor field-effect transistor (CMOSFET). The complimentary metal-oxide semiconductor (CMOS) is used for switching. A TMR device (e.g., see non-patent document 1) is used for recording and reading information. For additional detail on CMOS technology, see the following references.

[Non-patent document 1]
T. Miyazaki and N. Tezuka, J. Magn. Magn. Mater. 139, L231 (1995)

[Non-patent document 2]
F. J. Albert et al., Appl. Phys. Lett., 77 (2000) 3809

[Non-patent document 3]
Y. Ohno et al., Nature 402 790 (1999)

Conventional magnetic memory requires gate, source, and drain electrode wires for operating the CMOS that is used to switch TMR cells (information recording cells). Unfortunately, the conventional CMOS has a multitude of electrode wires.

A conventional magnetic memory reverses magnetization of the free layer in the TMR device to write information by using an in-plane static magnetic field generated by a current supplied to a bit line and a word line. Unfortunately, a very large amount of power is needed to induce a magnetic field enough to cause the magnetization reversal.

The conventional magnetic memory uses a TMR device whose resistance change in the TMR device is 40%, measured by an output signal of the TMR device. Unfortunately, such an output is relatively low.

SUMMARY OF THE INVENTION

The present invention provides a highly integrated, low-power-consumption, and high-output nonvolatile magnetic memory using a two-terminal-type memory cell comprising a semiconductor, a spin transfer torque magnetization reversal layer, and a TMR device. It should be appreciated that the present invention can be implemented in numerous ways, including as a process, an apparatus, a device or a method. Several inventive embodiments of the present invention are described below. The present invention has the following objectives.

A first objective is to decrease the number of electrode wires.

A second objective is to reduce the power required to reverse magnetization of a free layer in the TMR device independent of a current induced magnetic field.

A third objective is to increase output of the TMR device.

It is possible to provide magnetization reversal independent of switching and a current induced magnetic field by installing the above-mentioned two-terminal nonvolatile magnetic memory cell in the magnetic memory. Thus, it is possible to decrease a memory cell area and provide a large-scale integration.

In order to achieve the aforementioned objects, the present invention provides a nonvolatile magnetic memory having a bit line, a word line, and a layered element formed by being electrically connected to the bit line and the word line, wherein the layered element has a structure comprising a pn diode, a first ferromagnetic layer, a nonmagnetic layer, a second ferromagnetic layer, a tunnel barrier between ferromagnetic layers, and a third ferromagnetic layer all of which are layered in this order; the word line is electrically connected to the diode; and the bit line is electrically connected to the third ferromagnetic layer.

In such multilayer structure, the first ferromagnetic layer, the non magnetic layer, and the second ferromagnetic layer form a giant magnetoresistive (GMR) film. The second magnetic layer, the second tunnel barrier, and the third ferromagnetic layer form a TMR film. Of the GMR film, the first ferromagnetic layer, and the non magnetic layer function as spin transfer torque magnetization reversal layers. The second ferromagnetic layer functions as a ferromagnetic free layer for the GMR/TMR film. The first ferromagnetic layer functions as a static layer for the GMR film. The ferromagnetic layer functions as a free layer for the TMR film.

A p-type magnetic semiconductor is used for a p-type semiconductor constituting the pn diode.

The layered element is structured to comprise a Schottky diode comprising a semiconductor and a ferromagnetic layer, a non magnetic layer, a second ferromagnetic free layer, a tunnel barrier between ferromagnetic layers, a third ferromagnetic layer which are layered in this order.

An anti-ferromagnetic layer is provided between the bit line and the third ferromagnetic layer. There is provided a tunnel barrier between diode and ferromagnetic lalyer between the diode and the first ferromagnetic layer.

The Schottky diode is provided with a tunnel barrier between semiconductor and ferromagnetic layer as an intermediate layer between the semiconductor ad the first ferromagnetic layer.

A layered portion of the first ferromagnetic layer, the non magnetic layer, and the second ferromagnetic layer is configured to indicate spin torque magnetization reversal. A layered portion of the second ferromagnetic layer, the tunnel barrier between ferromagnetic layers, and the third ferromagnetic layer is configured to indicate a tunnel magnetoresistance effect.

Magnetization reversal causes the second ferromagnetic layer to function as a free layer.

The first and third ferromagnetic layers are configured to provide a fixed magnetization direction. A magnetization direction of the third ferromagnetic layer is configured to be fixed by an anti-ferromagnetic layer formed opposite to a side facing the tunnel barrier between ferromagnetic layers.

The invention encompasses other embodiments of a device, an apparatus, and a method which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

FIG. 4 shows yet another configuration example of the nonvolatile magnetic memory cell according to the present invention;

FIG. 5 shows still yet another configuration example of the nonvolatile magnetic memory cell according to the present invention;

FIG. 15 shows yet still another configuration example of the nonvolatile magnetic memory cell according to the present invention;

FIG. 16 shows still yet another configuration example of the nonvolatile magnetic memory cell according to the present invention;

DESCRIPTION OF THE PREFERRED EMBODIMENTS

An invention for a magnetic memory with a high-output memory cell capable of switching and magnetization reversal operations by means of two terminals is disclosed. Numerous specific details are set forth in order to provide a thorough understanding of the present invention. It will be understood, however, to one skilled in the art, that the present invention may be practiced without some or without all of these specific details.

First, the nonvolatile memory according to the present invention is provided with a diode and uses its switching capability, wherein the diode is formed of a semiconductor including a magnetic semiconductor. Diodes use a pn junction and a Schottky barrier formed on an interface between metal and semiconductor. A pn junction diode is also formed of a p-type magnetic semiconductor and an n-type compound semiconductor. The formed diodes are used for switching.

Second, a spin transfer torque magnetization reversal layer is provided on the diode. In order to write information, a spin current applied to the device reverses magnetization of the ferromagnetic layer functioning as a recording section. The spin transfer torque magnetization reversal layer is especially formed of a multilayer of a ferromagnetic layer such as Co and nonmagnetic metal such as Cu (see nonpatent document 2 for such multilayer). The spin transfer torque magnetization reversal layer causes magnetization reversal to write information.

Third, information is read by using a change in the TMR device resistance. As a sensing current, we used a spin current supplied from the magnetic semiconductor constituting the diode. This spin current has a very high spin polarization. The use of such sensing current makes it possible to provide a higher output that that of the conventional magnetic memory.

The present invention writes information by means of spin torque magnetization reversal using multilayers, eliminating a current-induced magnetic field and enabling the high density. Reading information by means of the tunnel magnetoresistance can provide high output by using a spin current with very high spin polarization supplied from the diode. The switching capability of diodes can greatly decrease the number of wires. As a result, the large-scale integration is improved and the processing speed is increased.

Embodiments of the present invention will be described in further detail with reference to the accompanying drawings.

Embodiment 1

Figure 1:
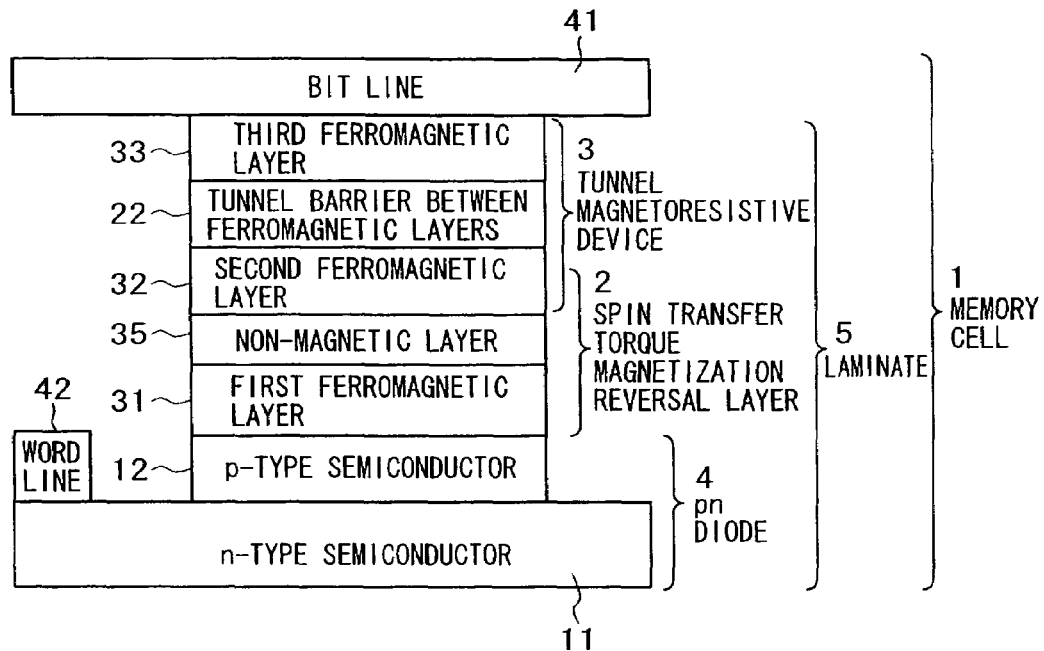
FIG. 1 shows a configuration example of a nonvolatile magnetic memory cell according to the present invention.

FIG. 1 schematically shows a sectional view of one memory cell according to the embodiment. A p-type semiconductor 12 is arranged on an n-type semiconductor 11 to form a pn junction. The pn junction comprises n-GaAs as an n-type semiconductor and p-GaAs as a p-type semiconductor. It may be preferable to use InGaAs for these semiconductors. The molecular beam epitaxy (MBE) is used to form the semiconductors.

Then, sputtering is used to form Co as a first ferromagnetic layer 31 and Cu as a non magnetic layer 35 without exposure from an ultra-high vacuum atmosphere. A laminated layer of the first ferromagnetic layer 31 and the non magnetic layer 35 is used to fabricate a spin transfer torque magnetization reversal layer 2. Then, a second ferromagnetic layer 32 of CoFe is formed, and a tunnel barrier between ferromagnetic layers 22 as Al is formed in this order.

Thereafter, plasma oxidation is applied to Al on the top surface without breaking the ultra-high vacuum atmosphere. An Al oxide is used to form the tunnel barrier between ferromagnetic layers 22. It is possible to use not only an Al oxide layer, but also Ha, Ta, Mg, and Ti oxides as the tunnel barrier between ferromagnetic layers 2. The sputtering is again used to layer CoFe as a third ferromagnetic layer 33 and fabricate a laminated layer for forming a memory cell. It may be preferable to use not only CoFe, but also NiFe for the first and third ferromagnetic layers. Here, the third ferromagnetic layer 32, the tunnel barrier between ferromagnetic layers 22, and the third ferromagnetic layer 33 form a tunnel magnetoresistive device 3.

In such multilayer structure, the first ferromagnetic layer 31, the non magnetic layer 35, and the second ferromagnetic layer 32 form a giant magnetoresistive device. Further, the second magnetic layer 32, the tunnel barrier 22 on the layer 2, and the third ferromagnetic layer 33 form the tunnel magnetoresistive device 3 as mentioned above. In the giant magnetoresistive device, the first ferromagnetic layer 31 and the non magnetic layer 35 function as a spin transfer torque magnetization reversal layer. The second ferromagnetic layer 32 functions as a ferromagnetic free layer for the giant magnetoresistive device or the tunnel magnetoresistive device. The first ferromagnetic layer 31 functions as a fixed layer for the giant magnetoresistive device. The third ferromagnetic layer 33 functions as a free layer for the tunnel magnetoresistive device 3. This functional configuration enables magnetization reversal of the second ferromagnetic layer 32 independent of a current-induced magnetic field as will be discussed below.

Photo lithography is used to form the memory cell 1. First, lithography and etching are used to process the laminated layer into a specified shape at a time. Then, in order to produce a memory cell of $0.1 \times 0.1 \mu m^2$, EB lithography and etching are used to process the laminated layer on the p-type semiconductor 12. A word line is fabricated thereafter. An insulating layer is formed to electrically insulate a bit line 41 and a word line 42. Finally, a bit line is produced.

Figure 13:
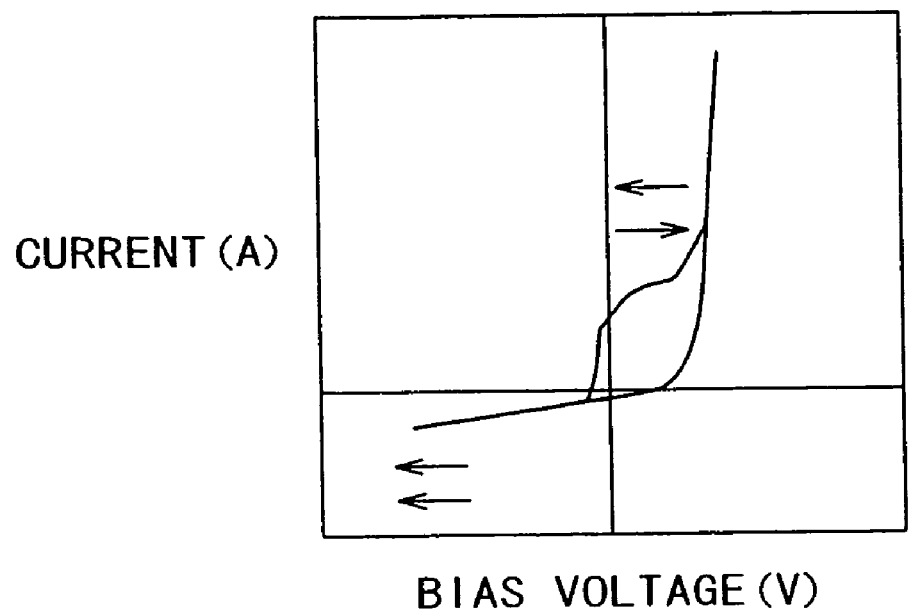
FIG. 13 shows typical data of current-voltage characteristics in the nonvolatile magnetic memory cell according to the present invention.
Figure 14:
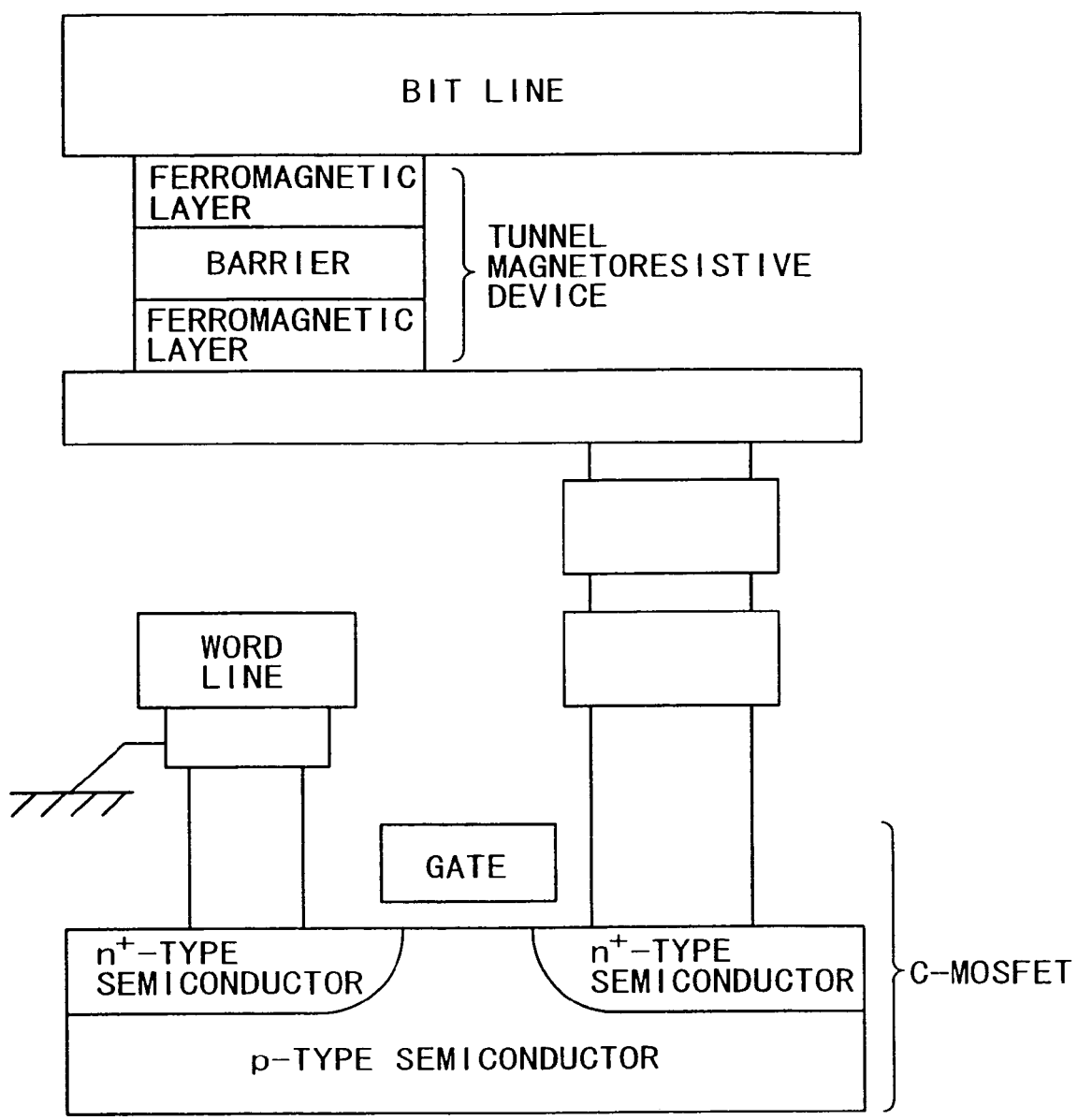
FIG. 14 schematically shows a typical sectional view of a conventional magnetic memory cell.
Figure 17:
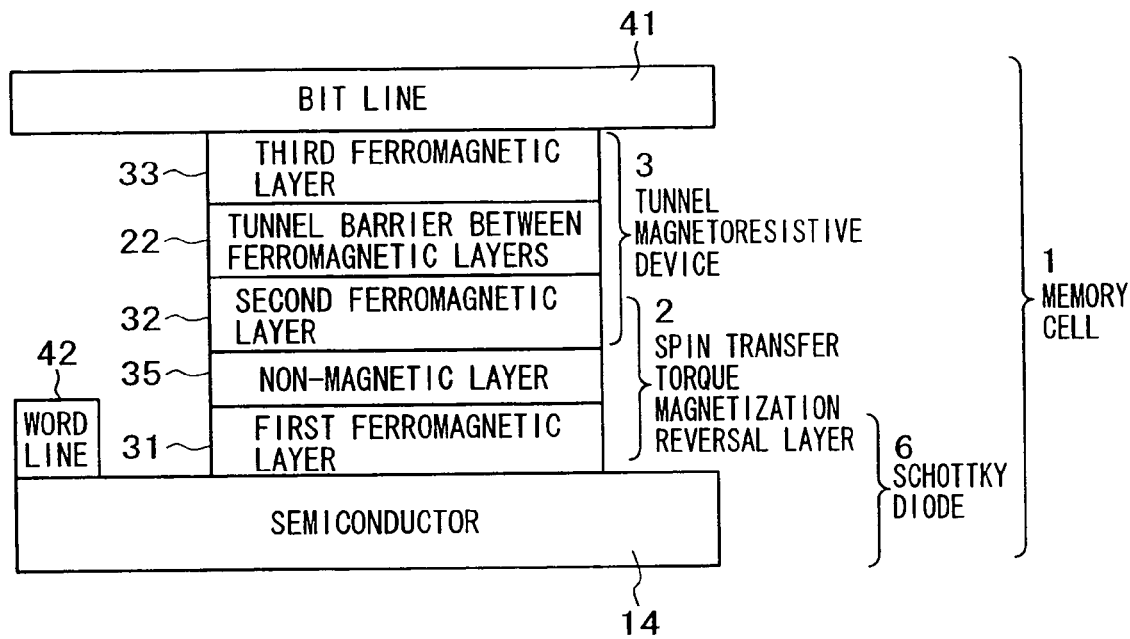
FIG. 17 shows yet still another configuration example of the nonvolatile magnetic memory cell according to the present invention.
Figure 18:
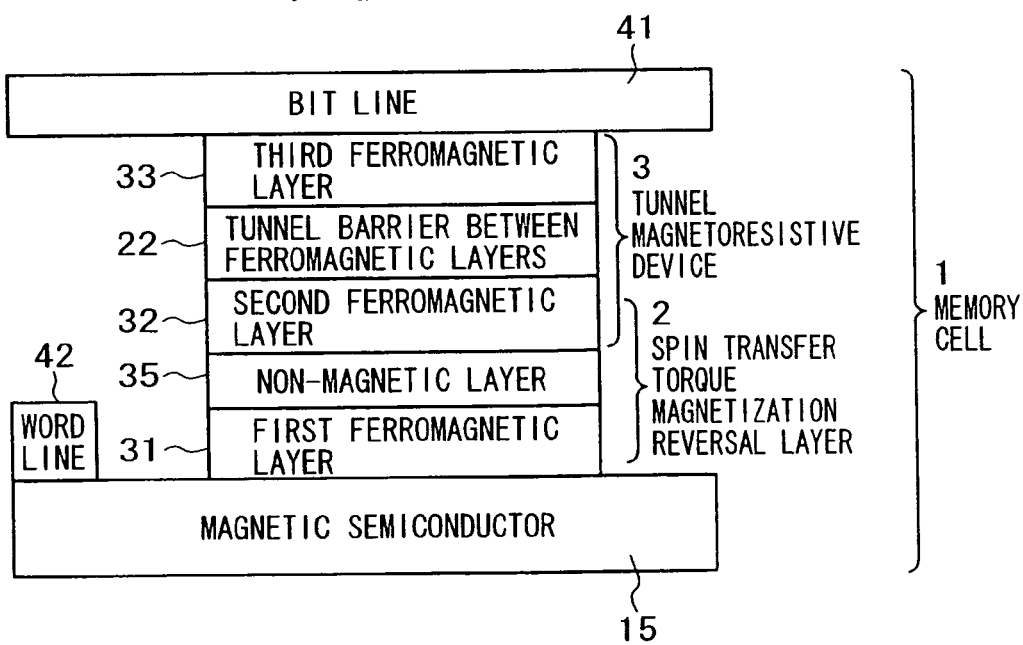
FIG. 18 shows still yet another configuration example of the nonvolatile magnetic memory cell according to the present invention.
Figure 19:
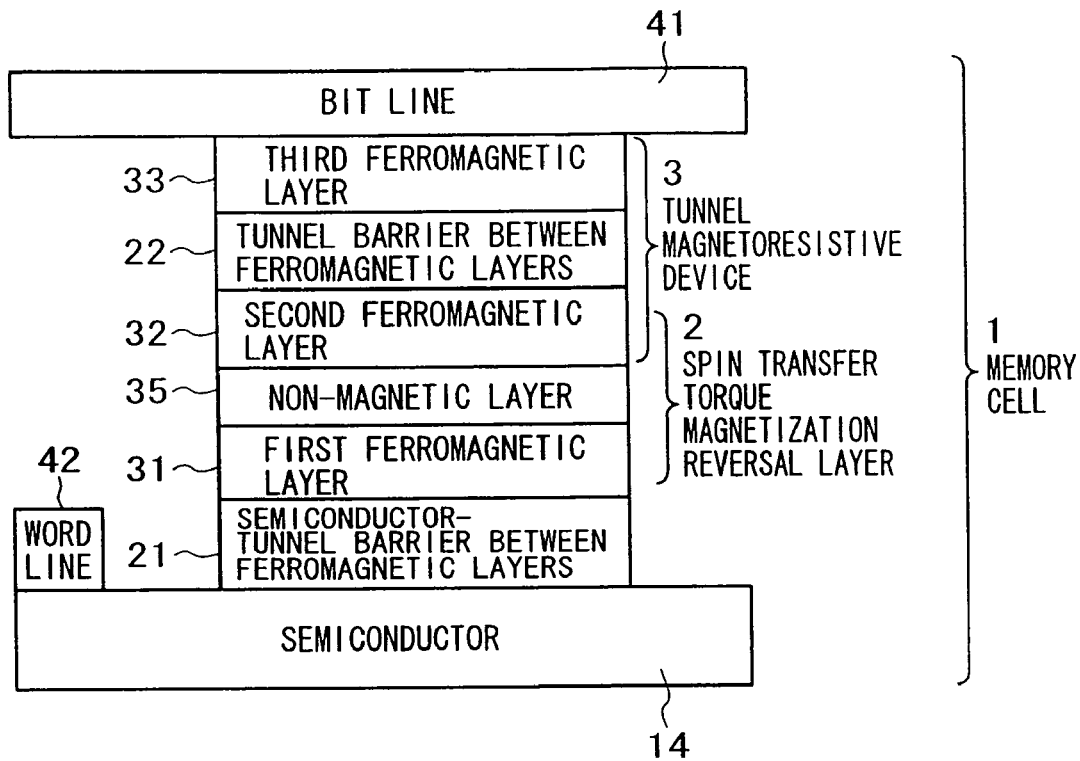
FIG. 19 shows yet still another configuration example of the nonvolatile magnetic memory cell according to the present invention.
Figure 20:
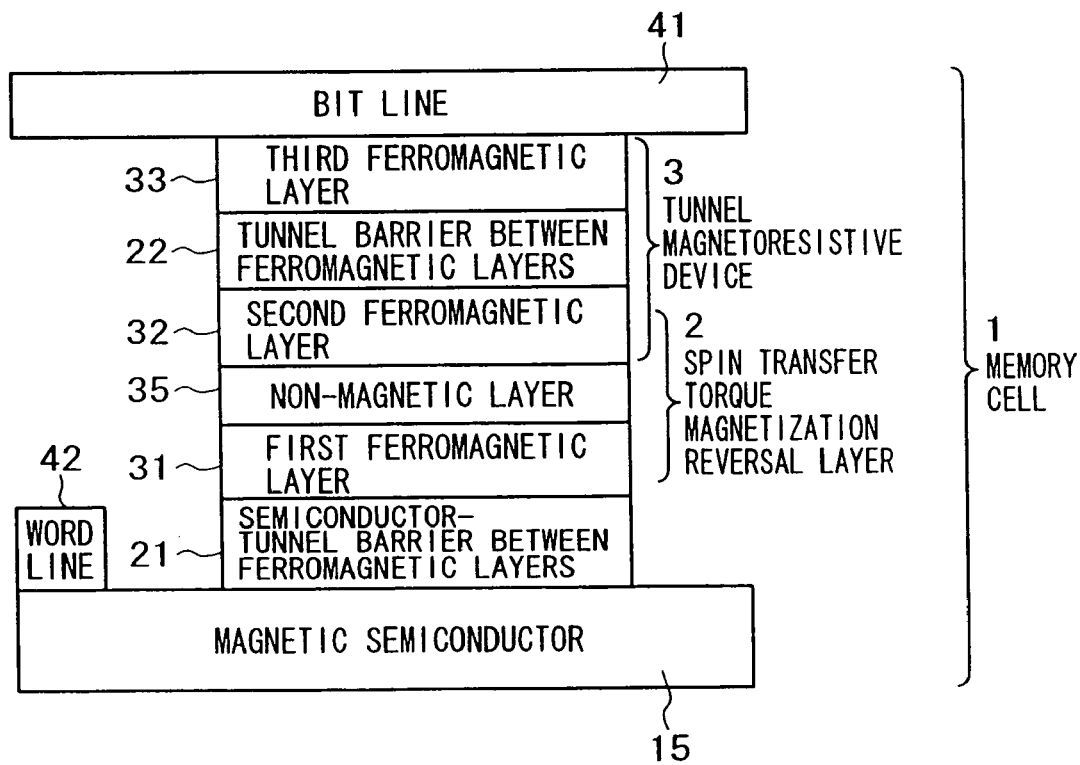
FIG. 20 shows still yet another configuration example of the nonvolatile magnetic memory cell according to the present invention.

The fabricated memory cell is measured for current-voltage characteristics at two terminals using the bit line and the word line as electrode terminals to yield rectification characteristics (switching) with the hysteresis as shown in FIG. 13. The rectification characteristics is based on the pn junction. A spin current flows from the spin transfer torque magnetization reversal layer 2 formed of Cu of the non magnetic layer 35 and Co of the ferromagnetic layer 31 and changes a magnetization direction of the second ferromagnetic layer 32. This changes the resistance of the tunnel magnetoresistive device 3 to cause the hysteresis. Accordingly, a current can be used to arrange the magnetization direction of the second ferromagnetic free layer 32 parallel or anti-parallel to the magnetization direction of the third ferromagnetic layer 33, allowing magnetization reversal independent of a current-induced magnetic field.

Figure 12:
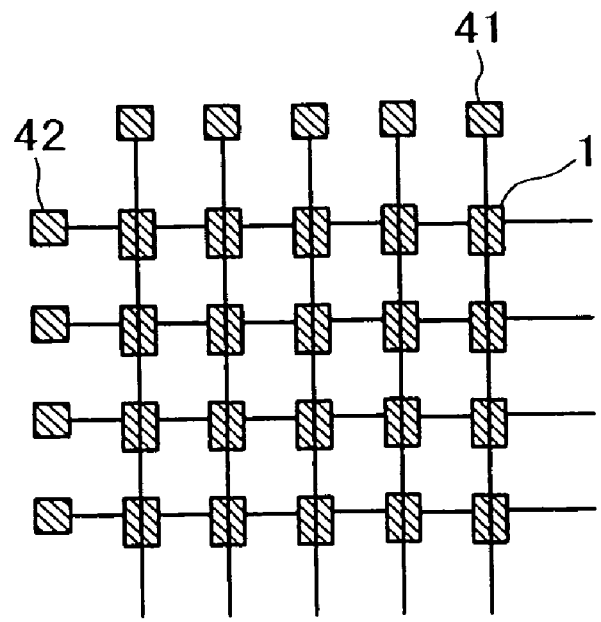
FIG. 12 shows a configuration example of nonvolatile magnetic memory comprising the nonvolatile magnetic memory cell according to the present invention.

FIG. 12 shows a schematic diagram of magnetic memory formed by integrating the memory cells 1 indicating the above-mentioned current-voltage characteristics. The memory cell 1 is capable of switching and magnetization reversal at two terminals. Accordingly, it is possible to provide 1-Gbit nonvolatile magnetic memory having a cell size of $4F^2$.

Embodiment 2

Figure 2:
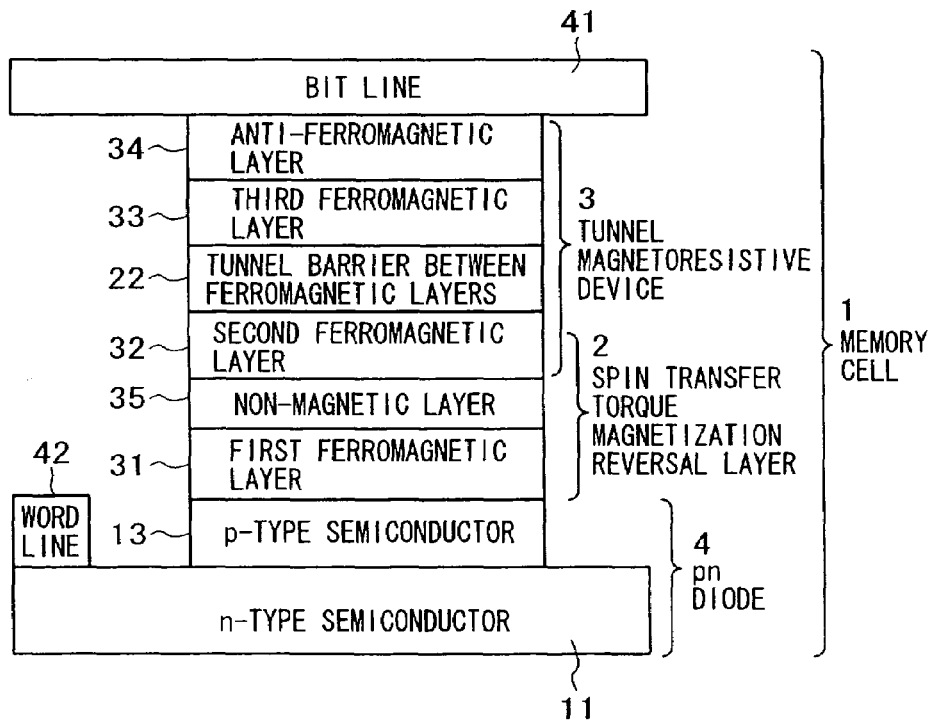
FIG. 2 shows another configuration example of the nonvolatile magnetic memory cell according to the present invention.

FIG. 2 schematically shows a sectional view of a memory cell having an anti-ferromagnetic layer 34 in order to fix the magnetization direction of the third ferromagnetic layer according to the configuration in FIG. 1. The anti-ferromagnetic layer 34 uses MnPt. The other layer configurations of the memory cell 1 are the same as for the embodiment 1. Like the embodiment 1, photo lithography and EB lithography are used to form cells.

Like the embodiment 1, the embodiment 2 can use a current to arrange the magnetization direction of the second ferromagnetic free layer 32 parallel or anti-parallel to the magnetization direction of the third ferromagnetic layer 33, allowing magnetization reversal independent of a current-induced magnetic field. The manufactured cell also yielded representative current-voltage characteristics as shown in FIG. 13.

Embodiment 3

Figure 3:
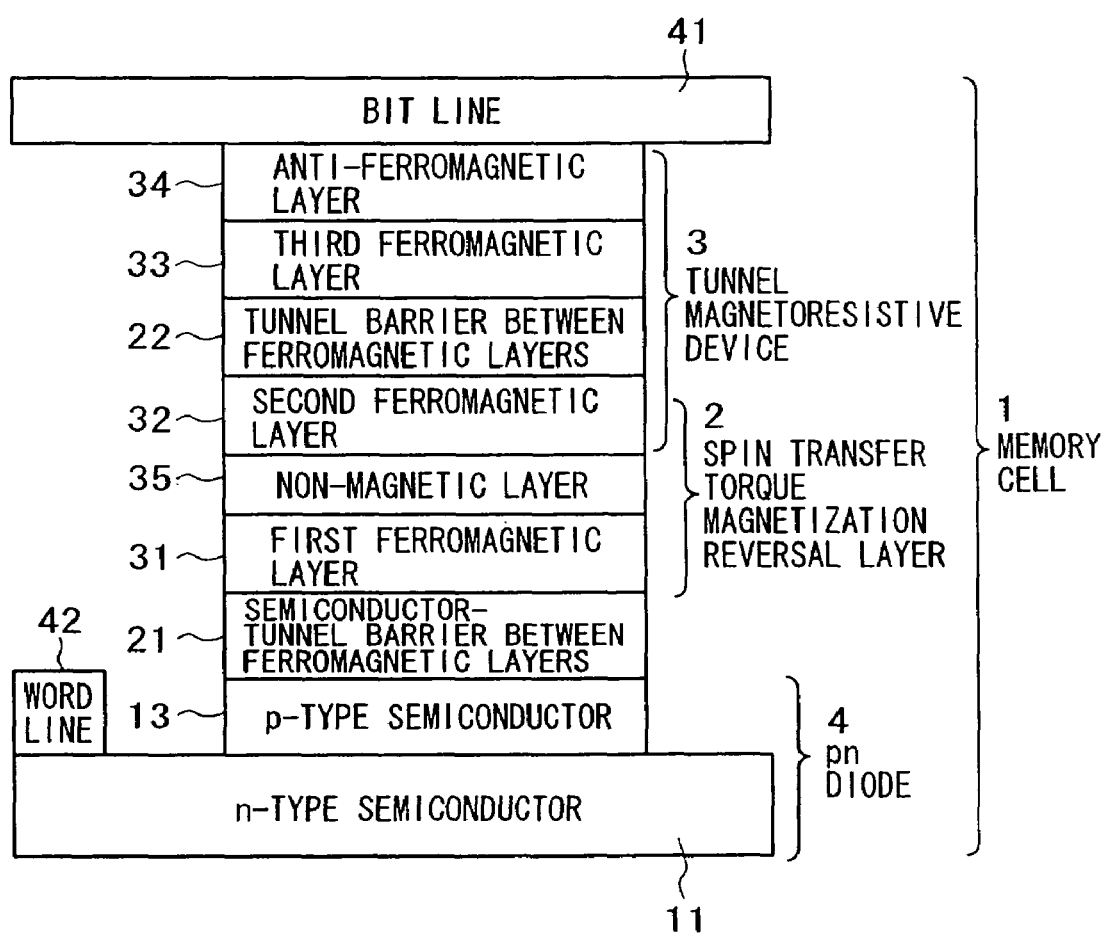
FIG. 3 shows still another configuration example of the nonvolatile magnetic memory cell according to the present invention.

FIG. 3 schematically shows a sectional view of a memory cell that forms a tunnel barrier between semiconductor and ferromagnetic layer between the pn diode and the first ferromagnetic layer according to the configuration in FIG. 2. This tunnel barrier between diode and ferromagnetic layer uses AlAs. The other layer configurations of the memory cell 1 are the same as for the embodiment 2. Like the embodiment 2, the embodiment 3 uses photo lithography, etching, and EB lithography to form cells.

Like the embodiment 1, the embodiment 3 can use a current to arrange the magnetization direction of the second ferromagnetic free layer 32 parallel or anti-parallel to the magnetization direction of the third ferromagnetic layer 33, allowing magnetization reversal independent of a current-induced magnetic field.

The manufactured cell also yielded representative current-voltage characteristics as shown in FIG. 13.

Embodiment 4

FIG. 4 schematically shows a sectional view of a memory cell that uses a p-type magnetic semiconductor 13 instead of the p-type semiconductor 12 according to the configuration in FIG. 2. The MBE technology is used to produce p-MnGaAs as the p-type magnetic semiconductor 13. The p-type magnetic semiconductor 13 may be made of p-MnGaN. The other layer configurations of the memory cell 1 are the same as for the embodiments 1 and 2. Like the embodiment 1, the embodiment 4 uses photo lithography, etching, and EB lithography to form cells.

Like the embodiment 1, the embodiment 4 can use a current to arrange the magnetization direction of the second ferromagnetic free layer 32 parallel or anti-parallel to the magnetization direction of the third ferromagnetic layer 33, allowing magnetization reversal independent of a current-induced magnetic field.

The manufactured cell also yielded representative current-voltage characteristics as shown in FIG. 13. Output is 10 times larger than that of the embodiment 1. This is because the p-type magnetic semiconductor 13 is used to supply the tunnel magnetoresistive device 3 with a current having very large spin polarization, increasing the magnetoresistance ratio.

Embodiment 5

FIG. 5 schematically shows a sectional view of a memory cell where the spin transfer torque magnetization reversal layer 2 and the tunnel magnetoresistive device 3 are serially formed on a semiconductor 14. Materials used for the spin transfer torque magnetization reversal layer 2 and the tunnel magnetoresistive device 3 are the same as for the embodiments 1 and 2. Like the embodiments 1 and 2, the embodiment 5 uses photo lithography, etching, and EB lithography to form memory cells.

Like the embodiment 1, the embodiment 5 can use a current to arrange the magnetization direction of the second ferromagnetic free layer 32 parallel or anti-parallel to the magnetization direction of the third ferromagnetic layer 33, allowing magnetization reversal independent of a current-induced magnetic field.

The manufactured cell provides representative current-voltage characteristics that contains rectification characteristics as shown in FIG. 13. The rectification characteristics a Schottky barrier produced on an interface between the ferromagnetic layer 31 and the semiconductor 14 Via this Schottky barrier, the semiconductor 14 injects a hot electron into spin transfer torque magnetization reversal induction layer and the tunnel magnetoresistive device, making it possible to provide high output sensitivity.

Embodiment 6

Figure 6:
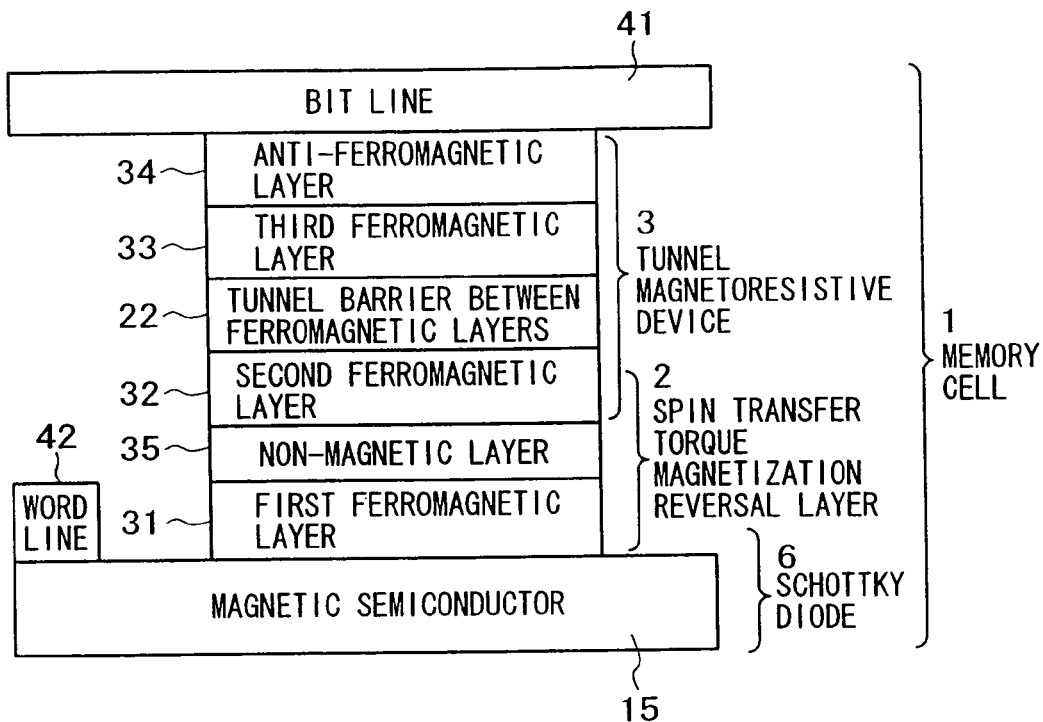
FIG. 6 shows yet still another configuration example of the nonvolatile magnetic memory cell according to the present invention.

FIG. 6 schematically shows a sectional view of a memory cell that uses a magnetic semiconductor 15 instead of the semiconductor 14 according to the configuration in FIG. 5. The magnetic semiconductor 15 uses GaMnAs. The other layer configurations of the memory cell 1 are the same as for the embodiment 5. Like the embodiment 2, the embodiment 6 uses photo lithography, etching, and EB lithography to form cells.

Like the embodiment 1, the embodiment 6 can use a current to arrange the magnetization direction of the second ferromagnetic free layer 32 parallel or anti-parallel to the magnetization direction of the third ferromagnetic layer 33, allowing magnetization reversal independent of a current-induced magnetic field.

The manufactured cell also yielded representative current-voltage characteristics containing current characteristics as shown in FIG. 13. Output is 10 times larger than that of the embodiment 5.

This is because the magnetic semiconductor 15 is used to supply the tunnel magnetoresistive device 3 with a current having very large spin polarization, increasing the magnetoresistance ratio.

Embodiment 7

Figure 7:
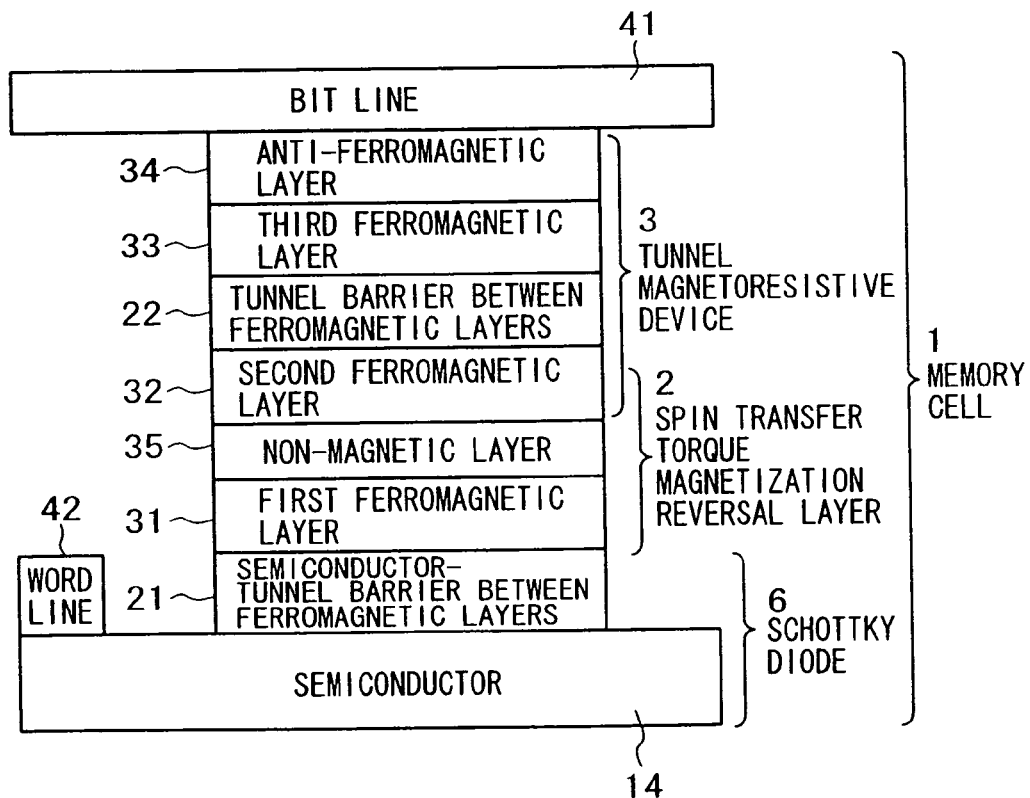
FIG. 7 shows still yet another configuration example of the nonvolatile magnetic memory cell according to the present invention.

FIG. 7 schematically shows a sectional view of a memory cell where the semiconductor 14 adjoins the first ferromagnetic layer 31 via the tunnel barrier between semiconductor and ferromagnetic layer 21 in the configuration of FIG. 5. The tunnel barrier between semiconductor and ferromagnetic layer uses AlAs. Materials used for the other layers are the same as for FIG. 5. Like the embodiment 1, the embodiment 7 uses photo lithography, etching, and EB lithography to form memory cells. In the memory cell according to the embodiment, the word line 42 is connected to the semiconductor 14.

Like the embodiment 1, the embodiment 5 can use a current to arrange the magnetization direction of the second ferromagnetic free layer 32 parallel or anti-parallel to the magnetization direction of the third ferromagnetic layer 33, allowing magnetization reversal independent of a current-induced magnetic field.

The current-voltage characteristics for the memory cell 1 also reveals rectification as shown in FIG. 13. This rectification is caused by transport characteristics of the semiconductor-metal junction via a tunnelable thin insulating layer, i.e., the MIS junction comprising the semiconductor 14, the tunnel barrier between semiconductor and ferromagnetic layer 21, and the first ferromagnetic layer 31 as a metal layer.

Embodiment 8

Figure 8:
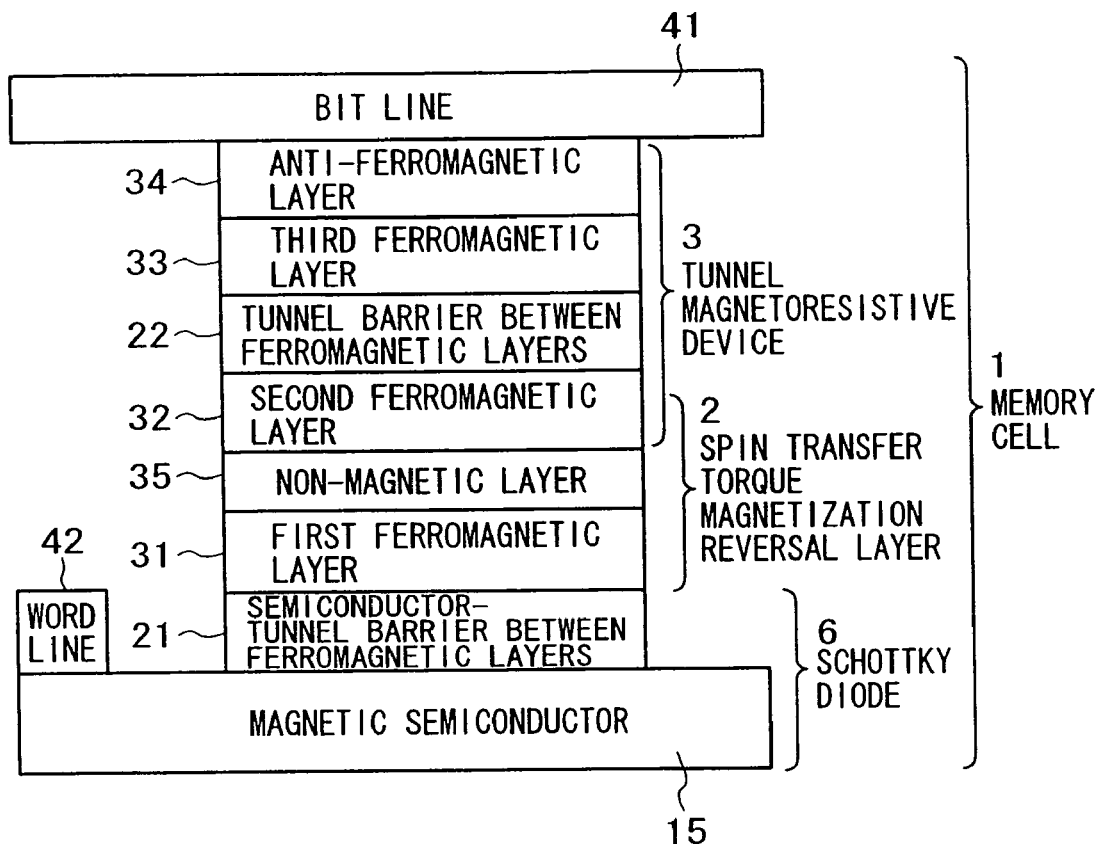
FIG. 8 shows yet still another configuration example of the nonvolatile magnetic memory cell according to the present invention.

FIG. 8 schematically shows a sectional view of a memory cell that uses a magnetic semiconductor 15 instead of the semiconductor 14 according to the configuration in FIG. 7. Like the embodiment 1, the embodiment 8 uses photo lithography, etching, and EB lithography to form cells. In the memory cell 1 according to the embodiment, the word line 42 is connected to the semiconductor 14.

Like the embodiment 1, the embodiment 6 can use a current to arrange the magnetization direction of the second ferromagnetic free layer 32 parallel or anti-parallel to the magnetization direction of the third ferromagnetic layer 33, allowing magnetization reversal independent of a current-induced magnetic field.

The current-voltage characteristics for the memory cell 1 also reveals rectification as shown in FIG. 13. Like in the embodiment 7, this rectification is caused by transport characteristics of the MIS junction comprising the semiconductor 14, the tunnel barrier between semiconductor and ferromagnetic layer 21, and the first ferromagnetic layer 31.

According to the embodiment the magnetic semiconductor 15 injects a highly polarized spin current, providing an output 10 times or larger than the embodiment 7.

Embodiment 9

Figure 9:
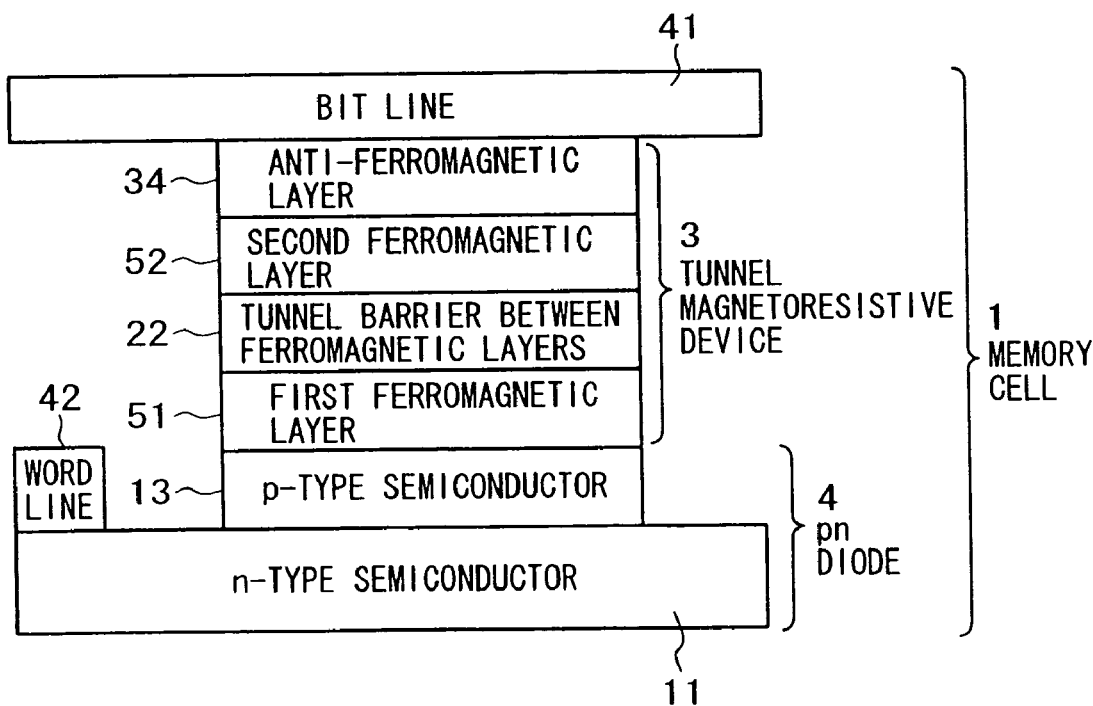
FIG. 9 shows still yet another configuration example of the nonvolatile magnetic memory cell according to the present invention.

FIG. 9 schematically shows a sectional view of the memory cell 1 where the p-type magnetic semiconductor 13 is formed on the n-type semiconductor 11 and the tunnel magnetoresistive device 3 is formed thereon. Like the embodiment 2 (FIG. 2), the tunnel magnetoresistive device 3 in the memory cell 1 comprises a ferromagnetic layer (a first ferromagnetic layer 51 in FIG. 9 corresponds to the second ferromagnetic layer 32 in FIG. 2), a tunnel barrier between ferromagnetic layers, a ferromagnetic layer (a second ferromagnetic layer 52 in FIG. 9 corresponds to the third ferromagnetic layer 33 in FIG. 2), and an anti-ferromagnetic layer. Like the embodiment 2, the embodiment 9 uses photo lithography, etching, and EB lithography to form memory cells.

The embodiment uses spin injection from the p-type magnetic semiconductor 13 into the first ferromagnetic free layaer 31 to reverse its magnetization.

Accordingly, the embodiment 9 can use a current to arrange the magnetization direction of the first ferromagnetic free layer 51 parallel or anti-parallel to the second ferromagnetic layer 52, allowing magnetization reversal independent of a current-induced magnetic field.

The manufactured cell also yielded representative current-voltage characteristics as shown in FIG. 13. Output is 10 times larger than that of the embodiment 1.

This is because the p-type magnetic semiconductor 13 is used to supply the tunnel magnetoresistive device 3 with a current having very large spin polarization, increasing the magnetoresistance ratio.

Embodiment 10

Figure 10:
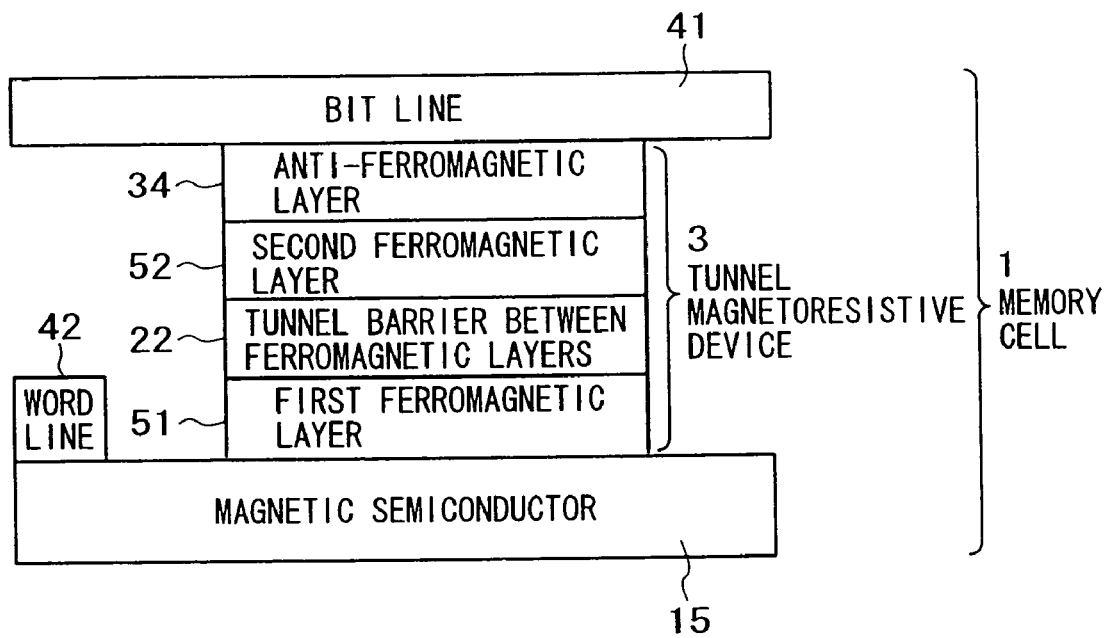
FIG. 10 shows yet still another configuration example of the nonvolatile magnetic memory cell according to the present invention.

FIG. 10 schematically shows a sectional view of the memory cell 1 where the tunnel magnetoresistive device 3 is formed on the magnetic semiconductor 15. Materials used for the layers are configured in the same manner as the embodiment 5. Like the embodiment 6 (FIG. 6), the tunnel magnetoresistive device 3 in the memory cell 1 comprises a ferromagnetic layer (a first ferromagnetic layer 51 in FIG. 10 corresponds of the second ferromagnetic layer 32 in FIG. 2), a tunnel barrier between ferromagnetic layers, the ferromagnetic layer (a second ferromagnetic layer 52 in FIG. 10 corresponds to the third ferromagnetic layer 33 in FIG. 2), and an anti-ferromagnetic layer. Materials used for the layers are configured in the same manner as the embodiment 5. Like the embodiment 6, the embodiment 10 uses photo lithography, etching, and EB lithography to form memory cells.

The embodiment uses spin injection from the magnetic semiconductor 15 into the first ferromagnetic free layer 31 to reverse its magnetization.

Like the embodiment 9, the embodiment 10 can use a current to arrange the magnetization direction of the first ferromagnetic free layer 51 parallel or anti-parallel to the second ferromagnetic layer 52, allowing magnetization reversal independent of a current-induced magnetic field.

The manufactured cell also yielded representative current-voltage characteristics as shown in FIG. 13. Output is 10 times larger than that of the embodiment 1.

This is because the magnetic semiconductor 15 is used to supply the tunnel magnetoresistive device 3 with a current having very large spin polarization, increasing the magnetoresistance ratio.

Embodiment 11

Figure 11:
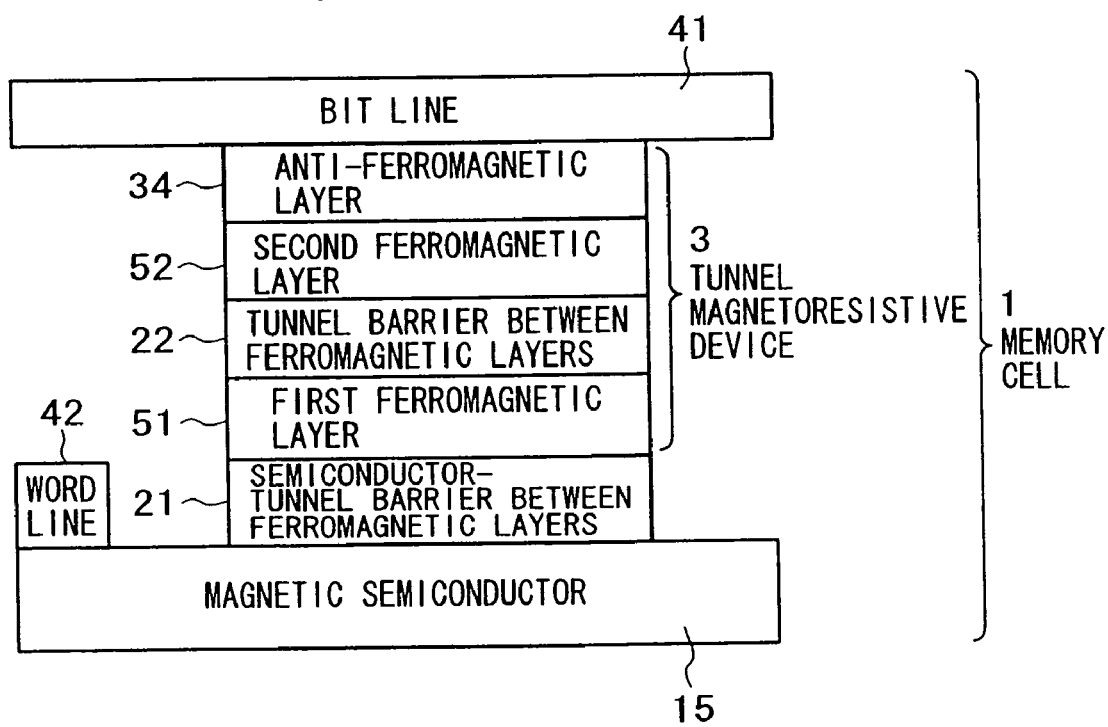
FIG. 11 shows still yet another configuration example of the nonvolatile magnetic memory cell according to the present invention.

FIG. 11 schematically shows a sectional view of the memory cell 11 where the first ferromagnetic layer 31 adjoins the magnetic semiconductor 15 via the tunnel barrier between semiconductor and ferromagnetic layer 21 in the configuration of FIG. 10. The tunnel magnetoresistive device 3 in the memory cell 1 comprises the same layers as those in the embodiment 8 (FIG. 8). Materials used for the layers are the same as for FIG. 8. Like the embodiment 1, the embodiment 11 uses photo lithography, etching, and EB lithography to form memory cells.

The embodiment uses spin injection from the magnetic semiconductor 15 into the first ferromagnetic free layer 31 to reverse its magnetization.

Like the embodiment 9, the embodiment 11 can use a current to arrange the magnetization direction of the first ferromagnetic free layer 51 parallel or anti-parallel to the second ferromagnetic layer 52, allowing magnetization reversal independent of a current-induced magnetic field.

The manufactured cell also yielded representative current-voltage characteristics as shown in FIG. 13. Output is 10 times larger than that of the embodiment 1.

This is because the magnetic semiconductor 15 is used to supply the tunnel magnetoresistive device 3 with a current having very large spin polarization, increasing the magnetoresistance ratio.

Embodiment 12

FIG. 12 exemplifies arrangement of the memory cell 1 applied to magnetic memory. The memory cell 1 uses two terminals to enable switching and spin torque magnetization reversal. This makes the memory cell arrangement very simple and decreases the number of wires, enabling highly large-scale integration of 4F.sup.2. The embodiment 12 can provide memory of 1 Gbit or more.

FIGS. 15 through 20 show the configurations in which the anti-ferromagnetic layer 34 is not contained in the memory cell described in the embodiments 3 through 8. Like the embodiment 1, these configurations can also use a current to arrange the magnetization direction of the second ferromagnetic free layer 32 parallel or anti-parallel to the magnetization direction of the third ferromagnetic layer 33, allowing magnetization reversal independent of a current-induced magnetic field.

Figure 21:
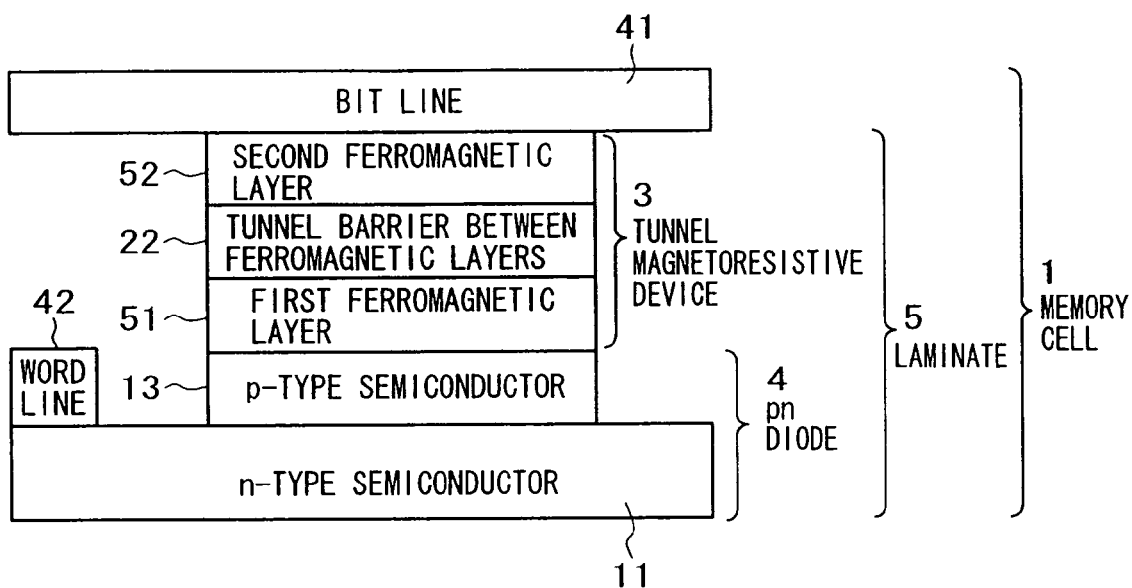
FIG. 21 shows yet still another configuration example of the nonvolatile magnetic memory cell according to the present invention.
Figure 22:
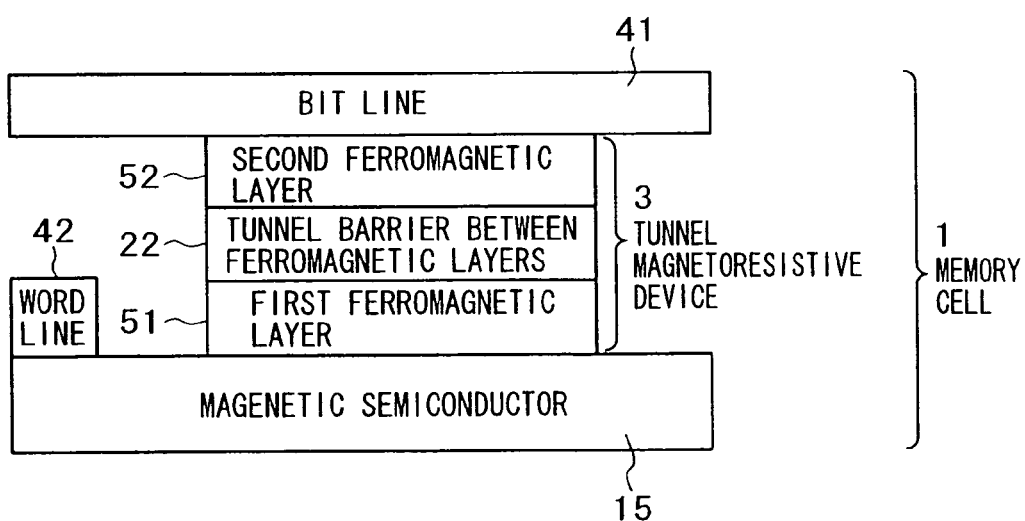
FIG. 22 shows still yet another configuration example of the nonvolatile magnetic memory cell according to the present invention.
Figure 23:
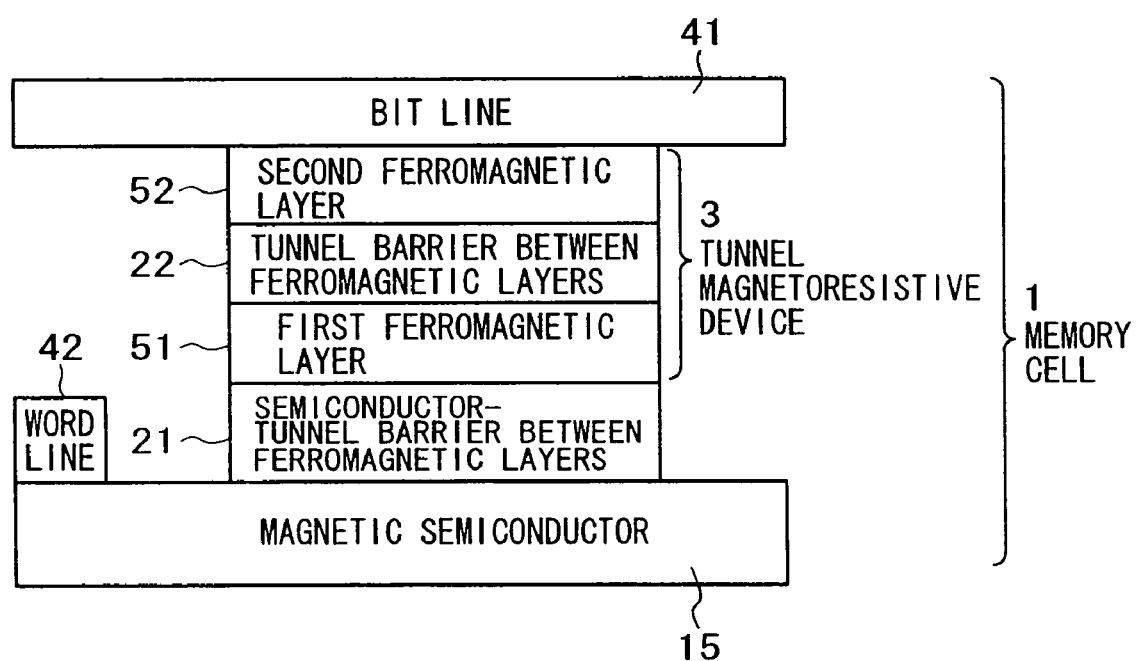
FIG. 23 shows yet still another configuration example of the nonvolatile magnetic memory cell according to the present invention.

FIGS. 21 through 23 show the configurations in which the anti-ferromagnetic layer 34 is not contained in the memory cell described in the embodiments 9 through 11. Like the embodiment 9, these configurations can also use a current to arrange the magnetization direction of the first ferromagnetic free layer 51 parallel or anti-parallel to the second ferromagnetic layer 52, allowing magnetization reversal independent of a current-induced magnetic field.

The manufactured cell also yielded representative current-voltage characteristics as shown in FIG. 13.

OTHER EMBODIMENTS

The present invention includes, but is not limited to, the following additional embodiments.

A nonvolatile magnetic memory is provided comprising a bit line; a word line; and a layered element having a layered structure having a Schottky diode including, a semiconductor, a first ferromagnetic layer, a non magnetic layer, a second ferromagnetic free layer, a tunnel barrier between ferromagnetic layers, and a third ferromagnetic layer all of which are layered in this order, wherein the word line is electrically connected to the semiconductor of the Schottky diode, and wherein the bit line is electrically connected to the third ferromagnetic layer.

Alternatively, in the nonvolatile magnetic memory, an anti-ferromagnetic layer is provided between the bit line and the third ferromagnetic layer.

Alternatively, in the nonvolatile magnetic memory, the Schottky diode is a magnetic semiconductor.

Alternatively, in the nonvolatile magnetic memory, the Schottky diode further includes a tunnel barrier between the semiconductor and the first ferromagnetic layer.

Alternatively, in the nonvolatile magnetic memory, layered portions for the first ferromagnetic layer, the non magnetic layer, and the second ferromagnetic layer indicate spin torque magnetization reversal.

Alternatively, in the nonvolatile magnetic memory, layered portions for the second ferromagnetic layer, the tunnel barrier between ferromagnetic layers, and the third ferromagnetic layer indicate a tunnel magnetoresistance effect.

Alternatively, in the nonvolatile magnetic memory, a magnetization direction of the first ferromagnetic layer is fixed.

Alternatively, in the nonvolatile magnetic memory, a magnetization direction of the third ferromagnetic layer is fixed.

Alternatively, in the nonvolatile magnetic memory, a magnetization direction of the third ferromagnetic layer is fixed by an anti-ferromagnetic layer formed opposite to a side facing the tunnel barrier between ferromagnetic layers.

Alternatively, in the nonvolatile magnetic memory, a coercive force of the third ferromagnetic layer is smaller than that of the second ferromagnetic layer.

Another nonvolatile magnetic memory is provided comprising a bit line; a word line; and a layered element having a layered structure of a pn diode and a tunnel magnetoresistive device, wherein a p-type semiconductor forming the pn diode is a p-type magnetic semiconductor, wherein the tunnel magnetoresistive device includes, a first ferromagnetic layer, a tunnel barrier between ferromagnetic layers, and a second ferromagnetic layer, wherein the word line is electrically connected to the pn diode, wherein the bit line is electrically connected to the second ferromagnetic layer.

Alternatively, in the nonvolatile magnetic memory, an anti-ferromagnetic layer is provided between the bit line and the second ferromagnetic layer.

Alternatively, in the nonvolatile magnetic memory, the magnetic semiconductor in a magnetic memory cell contains any one of Mn, Ga, As, In, Ge, Si, and Cr.

Alternatively, in the nonvolatile magnetic memory, the spin transfer torque magnetization reversal layer in a magnetic memory cell contains at least one of Co, Fe, Ni, Cu, Au, Ru, Al, Ag, and Pt.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A two-terminal memory cell comprising:
    a word line,
    a bit line intersecting with said word line, and
    a tunnel magnetoresistive (TMR) element formed at the intersection of said word line and said bit line
    wherein said TMR element has a first ferromagnetic layer, a second ferromagnetic layer and tunnel barrier formed between said first ferromagnetic and said second ferromagnetic layer, and a spin transfer torque magnetization reversal layer is formed between said first ferromagnetic layer and said word line
    wherein the tunnel carrier includes Al oxide, Ha oxide, Ta oxide, Mg oxide or Ti oxide.

2. The two-terminal memory cell according to claim 1, wherein said spin transfer torque magnetization reversal layer comprises said first ferromagnetic layer, a third ferromagnetic layer and a non-magnetic layer formed between said third ferromagnetic layer and first ferromagnetic layer.

3. The two-terminal memory according to claim 1, wherein a magnetization of said first spin transfer torque magnetization reversal layer reverses ferromagnetic layer.

4. The two-terminal memory cell according to claim 3, wherein a magnetization of said first ferromagnetic layer is reversed by a spin current.

5. The two-terminal memory cell according to claim 2, wherein a magnetization of said first ferromagnetic layer is reversed as write information is recorded on said TMR element, and a magnetization of said second ferromagnetic layer is fixed.

6. The two-terminal memory cell according to claim 2, wherein a magnetization of said first ferromagnetic layer is reversed as write information is recorded on said TMR element, and an anti-ferromagnetic layer is formed between said second ferromagnetic layer and said bit line.

* * * * *